United States Patent [19]

Kaiser et al.

[11] Patent Number: 4,591,417
[45] Date of Patent: May 27, 1986

[54] TANDEM DEPOSITION OF CERMETS

[75] Inventors: William J. Kaiser, Farmington Hills; Eleftherios M. Logothetis, Birmingham, both of Mich.

[73] Assignee: Ford Motor Company, Dearborn, Mich.

[21] Appl. No.: 706,819

[22] Filed: Feb. 28, 1985

Related U.S. Application Data

[63] Continuation of Ser. No. 566,053, Dec. 27, 1983, abandoned.

[51] Int. Cl.$^4$ ............................................. C23C 14/34
[52] U.S. Cl. ........................ 204/192 R; 204/192 SP; 204/192 D; 427/38; 427/45.1; 427/248.1; 427/250; 427/255
[58] Field of Search ......... 204/192 R, 192 SP, 192 D; 427/38, 45.1, 250, 251, 255, 248.1, 376.3, 255.2

[56] References Cited

U.S. PATENT DOCUMENTS

| | | | |
|---|---|---|---|
| 3,308,528 | 3/1967 | Bullard et al. | 427/250 |
| 3,363,998 | 1/1968 | Keister et al. | 427/250 |
| 3,462,723 | 8/1969 | Phillips | 427/250 |
| 3,586,614 | 6/1971 | Boggs et al. | 427/250 |
| 4,013,830 | 3/1977 | Pinch et al. | 204/192 SP |
| 4,021,277 | 5/1977 | Shirn et al. | 204/192 R |
| 4,312,915 | 1/1982 | Fan | 427/376.3 |
| 4,317,850 | 3/1982 | Verburgh et al. | 427/376.3 |
| 4,465,577 | 8/1984 | Tanielian | 204/192 SP |

FOREIGN PATENT DOCUMENTS 1169747  7/1967  United Kingdom ......... 204/192 SP

OTHER PUBLICATIONS

Hanak et al., "Calculation of Deposition Profiles & Compositional Analysis of Cosputtered Film", Applied Physics, pp. 1666–1673, 1972.

Primary Examiner—Sadie L. Childs
Attorney, Agent, or Firm—Robert D. Sanborn; Peter Abolins

[57] ABSTRACT

A metal and an insulator are alternately deposited on a substrate. The alternate deposition is continued until the desired film thickness of the cermet is obtained, at least one of the metal or insulator materials being deposited in sufficiently small quantities so that only a discontinuous film of that material is formed during a deposition. The metal insulator composition of the cermet is controlled by the relative deposition rates of the insulator metal. The metal particle size is controlled by the duration of each metal deposition.

8 Claims, 6 Drawing Figures

TANDEM DEPOSITION OF CERMETS

This is a continuation application of Ser. No. 566,053 filed on Dec. 27, 1983 and now abandoned.

BACKGROUND OF THE INVENTION

1. Field of the Invention

This invention pertains to a method for producing metal/insulator composite materials (cermets).

2. Prior Art

Composite two phase materials consisting of finely dispersed mixtures of immiscible metals, materials with relatively high conductivity, and insulators, materials with substantially lower conductivity, have been studied extensively and are finding an increasing use in a variety of applications. These applications include film resistors for microelectronics fabrication, ferromagnets for magnetic core materials, optical materials for solar energy conversion systems and piezoresistive materials for pressure measurement. The microstructure and physical properties (e.g. electrical, optical, magnetic) of these composite materials, also known as cermets, depend very sensitively on the method of preparation.

Conventionally, cermet films can be prepared either by co-sputtering or co-evaporation of immiscible metals and insulators or by screen-printing of inks. Such inks have insulator and metal particles suspended in a viscous organic fluid and, after screen-printing, are dried and fired. A widely used method for preparing cermet films is by sputtering from a composite target 10 as shown schematically in FIG. 1A. A typical composite target includes a disc where part of the disc is composed of a metallic component and part is composed of an insulator 12. A plasma discharge in a low pressure gas (e.g. argon) is supported between target 10 and a substrate 13 by the application of a radio frequency (RF) electric field. The gas ions impinge on target 10 and sputter off target material. Both target 10 and substrate 13 are held stationary. The deposition rate of material from each component of target 10 is non-uniformly distributed across substrate 13.

Also, U.S. Pat. No. 4,021,277 to Shirn et al teaches forming a thin metal alloy film of nickel chromium by rotating a substrate under a plurality of sputtering cathodes. The substrate is alternately disposed directly beneath a chromium-plated target and a nickel chromium target. The sputtering rate of each target is individually controlled by adjusting an associated power supply level.

Determining the volume fraction of metal in the sputtered composite film requires measurement of the sputter yield of the two components of the composite target, shown in FIG. 1A. Given these yields and the dependence of the thickness of the film on a substrate location parameter, s, (see FIG. 1A), Hanak's model (see J. J. Hanak, H. W. Lehman, and R. K. Wehner, J. Appl. Phys. 43, 1666 '72) predicts the volume fraction of metal, f, as a function of s. The target configuration of FIG. 1A allows the preparation in a single run of samples with metal volume fraction, f, that spans a large part of the range from 0 to 1. On the other hand, the size of a sample with a given, uniform composition is very small.

A more uniform composition over a large area may be obtained with a composite target configuration 15 indicated in FIG. 1B. Composite films prepared by co-sputtering show a strong dependence of the composite particle size on the composite metal volume fraction.

The composite target method produces metal/insulator composites which for a metal volume fraction, f, less than about 0.5–0.6, have metal particles with a wide range of shapes and a broad size distribution. Furthermore, the average size distribution is found to depend on the metal volume fraction as shown in FIG. 2. This means that the particle size cannot be changed independently of the volume fraction.

Since the physical properties of the two-phase metal and insulator composites, i.e. cermets, depend not only on the metal volume fraction but also on the average metal particle size and shape, the particle size spread and the type of distribution of the particles in the insulator, it would be desirable to have a method that provides uniform metal particle size and shape, provides uniform metal particle distribution in the insulator and allows control of particle size independently of metal volume fraction. These are some of the problems this invention overcomes.

SUMMARY OF THE INVENTION

In accordance with an embodiment of this invention, a method for forming a two-phase metal/insulator composite material (cermet) produces metal particles uniformly sized and uniformly distributed in the insulator. The method provides for separate control of the relative metal and insulator composition of the cermet and metal particle size. The method includes depositing a small amount of a first metal on a substrate from a metal deposition source and then discontinuing deposition of the first metal on the substrate. Subsequently, a small amount of an insulator is deposited on the substrate from an insulator deposition source and the deposition of the insulator is discontinued. The previous steps are sequentially repeated until the desired film thickness of the cermet is obtained. Each deposition of at least one of either the metal or the insulator is sufficiently small so that a discontinuous film of that material is produced.

Characteristics of the cermet sputtering deposition method in accordance with an embodiment of this invention are that (1) it supplies materials (with $f < 0.5$–0.6) with well-defined metal particle size and shape and uniformly distributed within the insulating matrix, and (2) it allows separate control of cermet compositions (metal volume fraction) and particle size. Because of these characteristics, the method of this invention provides cermets with improved physical properties not only due to improved uniformity in the microstructure of the cermet but also because physical properties can be optimized by separate optimization of cermet composition and metal particle size.

Furthermore, the method of this invention offers additional advantages when compared with prior art co-sputtering or co-evaporation methods. These include the following:

(a) Preparation of large area cermets with uniform composition and film thickness is very conveniently accomplished.

(b) The average power dissipation in the substrate can be adjusted to be very low, which allows the use of heat sensitive substrate materials.

(c) The metal volume fraction of cermets can be easily changed by changing, for example, relative power applied to the two targets, whereas in the prior art co-sputtering method, the target composition must be changed each time it is desired to change the metal volume fraction.

(d) The metal volume fraction of the cermet can be very accurately measured and controlled.

DETAILED DESCRIPTION OF THE PREFERRED EMBODIMENT

A cermet preparation method according to this invention involves the sequential deposition on a substrate of small amounts of each component of the composite. This process is repeated until a cermet film with the desired thickness is obtained using such a "tandem deposition" technique.

Figure 3:
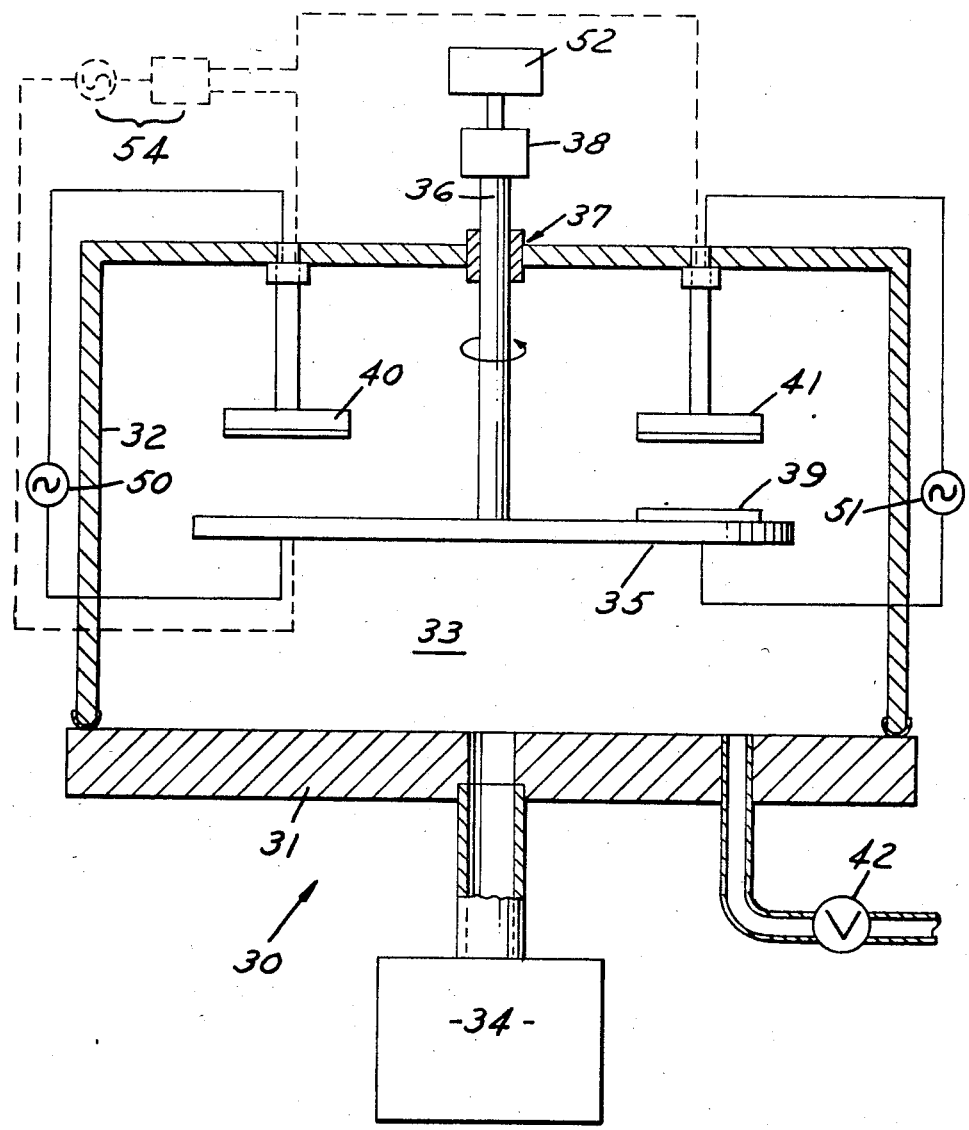
FIG. 3 is a schematic drawing of a sputtering system including two targets and a rotating turntable supporting a substrate in accordance with one embodiment of this invention.

FIG. 3 shows schematically a sputtering system 30 suitable for carrying out the method of this invention. This system includes a metal base plate 31 and a metal bell jar 32 that seals on base plate 31 to form an enclosed space 33. Vacuum is created in enclosed space 33 with a pumping station 34. A turntable 35 is supported by a shaft 36 which is mounted on a rotary vacuum feedthrough 37 on the top of bell jar 32. Shaft 36 is driven by a motor 38 so that turntable 35 rotates. Motor 38 is driven by a controller 52 that can be programmed to move turntable 35 in a continuous rotation at a desired rate, in a rotation with stops or in an oscillatory motion through some portion of a full circle. A sample substrate 39 is mounted eccentrically on the top surface of turntable 35.

A metal target 40 is mounted several inches above turntable 35 and has a surface generally parallel to turntable 35. Target 40 is centered such that rotating substrate 39 passes directly underneath. An insulating target 41 is mounted symmetrically, preferably located 180° apart, from metal target 40. When turntable 35 is rotated, substrate 39 is alternately brought under metal target 40 and insulating target 41. Radio frequency power and monitoring circuits 50 and 51 are coupled to targets 40 and 41, respectively, so that the sputtering process can be adjusted, controlled and monitored. If a single radio frequency power source is used, the radio frequency power is distributed between the two targets with an appropriate adjustable power splitter circuit 54, shown in dotted outline. In the sputtering system of FIG. 3, turntable 35 is an integral part of the radio frequency target-plasma-substrate circuit and must rotate precisely and reproducibly.

In operation, a clean substrate 39 is mounted on turntable 35 with a surface facing targets 40 and 41. Bell jar 32 is sealed to base plate 31 and space 33 is evacuated. A sputter promoting gas, e.g. argon, is introduced into the system through a conduit 42 to establish a pressure of a few microns of mercury. Radio frequency power is applied to targets 40 and 41 and a plasma discharge is initiated between targets 40, 41 and turntable 35. Motor 38 is activated to rotate turntable 35 and bring substrate 39 successively under targets 40 and 41. The relative amount of material deposited on substrate 39 from each target 40, 41, which determines the composition of the cermet, is precisely controlled by the ratio of the powers supplied to each target 40, 41 by the power and monitoring circuits 50 and 51. On the other hand, the metal particle size in the composite is found to depend, in the present preparation method, on the amount of material deposited on substrate 39 during each pass under a target and the rate of deposition. Generally, metal particle size increases with decreasing turntable rotation rate. Thus, the duration of each deposition and the interval between depositions may have an effect on metal particle size. Therefore, this method allows for the metal particle size to be varied while holding the composition of the composite at a fixed value by varying the turntable rotation rate. In summary, the metal-insulator composition of the cermet is dependent on the relative rates of deposition of the metal and the insulator. The metal particle size is dependent on the duration of each deposition. When sputter deposition of the metal is discontinued before a continuous film is formed then a discontinuous metal film is formed so that at least some of the sputter deposited metal particles, not at the boundary of the substrate, have at least a side portion not touching another sputter deposited metal particle.

Figure 1A:
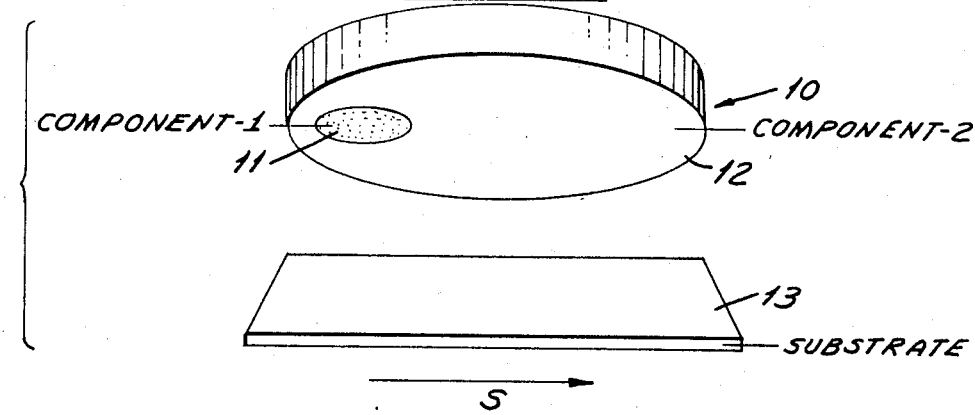
FIG. 1A is a schematic perspective view of a sputtering system for the preparation of cermets in accordance with the prior art.
Figure 1B:
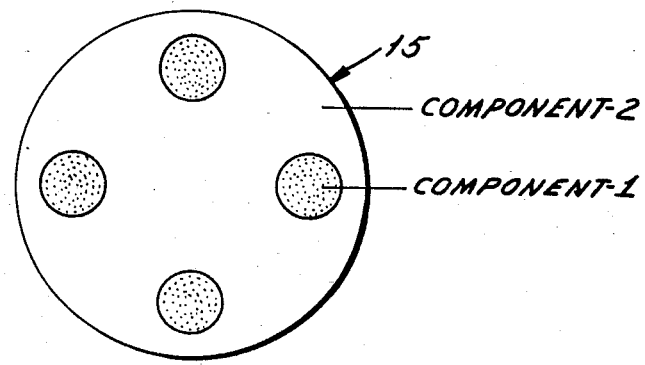
FIG. 1B is a composite target configuration that produces a cermet with more uniform composition over a large area in accordance with the prior art.
Figure 2:
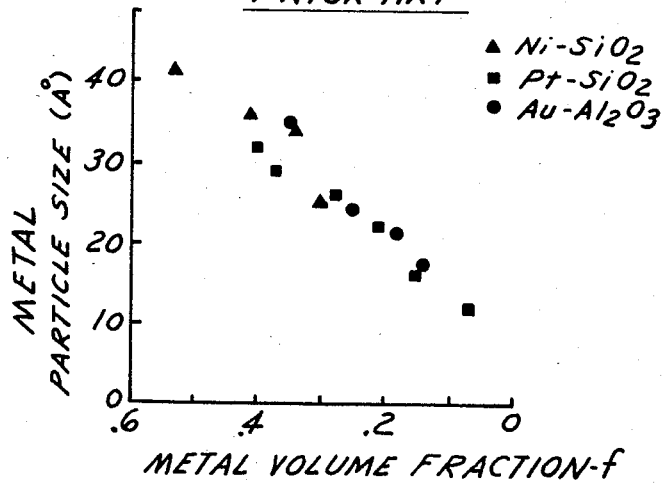
FIG. 2 is a graphical representation of the relationship between metal particle size and metal volume fraction of the composite for a number of different composites prepared in accordance with the prior art methods of FIGS. 1A and 1B.
Figure 4:
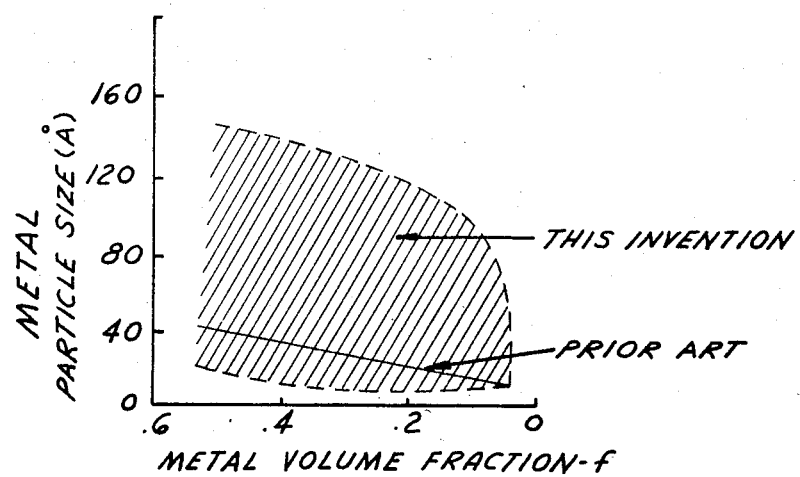
FIG. 4 is a graphical representation comparing the metal-particle-size vs. metal-volume-fraction relationship of composites in accordance with this invention and in accordance with the prior art of FIGS. 1A and 1B and showing that in accordance with the method of this invention, particle size can be changed independently of the volume fraction.

FIG. 4 compares the metal-particle-size vs. metal-volume-fraction relationship of the composites according to this invention and according to the prior art (FIGS. 1A, 1B and 2). The comparison indicates the wide range of metal particle size that can be obtained for a given cermet composition with the present method. In addition, it is found that over a wide range of metal volume fractions (e.g. $0.4 < f \leq 1$), turntable rotation rates and radio frequency power levels, the cermets contain spherical metal particles with their size in a very narrow range and dispersed uniformly in the insulator.

Figure 5:
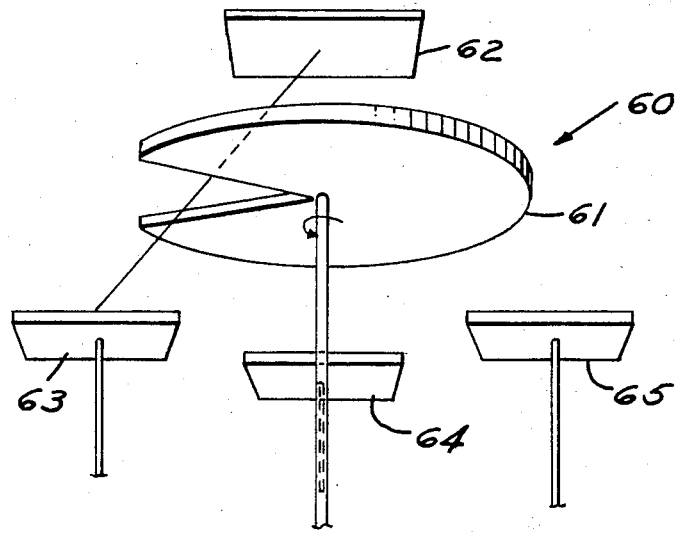
FIG. 5 is a schematic drawing of an evaporation deposition system having the targets and a rotating shutter selectively exposing a substrate on which a cermet film is deposited.

Referring to FIG. 5, another embodiment 60 of this invention uses a rotating shutter 61 positioned between a substrate 62 and a metal target 63, a metal target 64, and an insulator target 65. Targets 62, 63 and 64 are heated so deposition of the target material occurs on substrate 62 when rotation of shutter 61 provides an unblocked path between substrate 62 and one of targets 63, 64 or 65.

Table I below provides an example of a cermet preparation according to an embodiment of this invention.

TABLE I

| Au/SiO$_2$ | |
|---|---|
| Sputtering gas | Ar |
| Sputtering gas pressure | 4 microns of Hg (mercury) |

TABLE I-continued

| Au/SiO$_2$ | |
|---|---|
| RF - power source | Single 1 kW power supply with power splitter |
| Total RF - power supplied to target | 100 watts |
| Metal (Au)-target D.C. bias | 200-650 V (depending on power splitter setting) |
| Insulator (SiO$_2$)-target D. C. bias | 160-200 V (depending on power splitter setting) |
| Substrate material | Glass, sapphire, carbon |
| Substrate cooling | Water cool the substrate table |
| Material deposited on substrate for each pass under targets | 0.1-200 Å per pass |

This cermet is made from gold (Au) as the metal and silicon dioxide (SiO$_2$) as the insulator. The metal target is a 7.6 cm disc made from 99.99% pure gold. The insulator target is a 20 cm disc made from 99.999% pure SiO$_2$. The distance between targets and substrate is about 5 cm. The conditions during sputtering are shown in Table I. The choice of the relative power to the Au and SiO$_2$ targets determines the metal volume fraction f. The relationship between radio frequency power and cermet composition for a given metal/insulator combination can be established by experimentation. Because of the difficulty in accurately measuring the radio frequency power to each of the two targets, the system is calibrated in terms of the total radio frequency power and the D.C. bias voltage effectively applied to each target by the radio frequency source. The cermet composition can be determined by different known techniques.

Table II below shows the values of the D.C. bias voltage to the two targets and the sputtering deposition rate from the two targets (in Angstroms/minute) required to obtain cermets with the gold volume fractions shown.

TABLE II

| Metal Volume Fraction of Composite | Au/SiO$_2$ Composite | | | |
|---|---|---|---|---|
| | D.C. Bias Voltage to Targets | | Deposition Rates from Targets | |
| | Au | SiO$_2$ | Au | SiO$_2$ |
| 0.35 | 240 volts | 167 volts | 13 Å/min | 24 Å/min |
| 0.50 | 630 volts | 200 volts | 19 Å/min | 19 Å/min |

Table III below shows an example of how the rotation speed of the substrate affects the metal particle size when the cermet composition is kept constant. One can also see in Table III that the particle size distribution is very narrowly centered around the average size.

TABLE III

| Au/SiO$_2$ Composite with Metal Volume Fraction f = 0.15 | | | | |
|---|---|---|---|---|
| Frequency of Substrate Rotation | Amount of Material Deposited per Pass | | Au Particle Average Size | Tolerance for which 70% of Au Particle Sizes Equal Average |
| | Au | SiO$_2$ | | |
| 6.9 × 10$^{-2}$ Hz | 0.15Å | 0.85Å | 20Å | 3Å |
| 4.3 × 10$^{-3}$ Hz | 1.5Å | 8.5Å | 30Å | 3Å |
| 6.2 × 10$^{-4}$ Hz | 13Å | 72Å | 60Å | 6Å |

From the above Table III, it can be appreciated that if the amount of silicon dioxide material deposited per pass is divided by the amount of gold material deposited per pass, the resulting quotient has a magnitude of from about 5.5 to about 5.6. For example, 0.85 angstroms of silicon dioxide divided by 0.15 angstroms of gold is about 5.6.

It is appreciated that the teachings of this invention including the use of sequential deposition of small amounts of each cermet component to obtain a cermet with the described improved microstructure can be carried out by means other than the ones described explicitly aboe. Some examples are the following:

(1) The substrate is kept stationary and the targets are rotated.

(2) Both substrate and targets are stationary and sequential deposition from each target is accomplished with an appropriate movable (e.g. rotating) shutter.

(3) Both substrate and targets are stationary and sequential deposition from each target is accomplished by sequentially turning on and off the power to each target.

(4) Instead of a continuous rotation of the substrate, the relative amount of material deposited sequentially from each target can be adjusted by using, for example, different rates of rotation during the passage of the substrate under each target, or by interrupting the rotation and leaving the substrate under each target for different lengths of time.

(5) Deposition sources other than sputtering sources can be used. In particular, two electron beam deposition sources, or two thermal evaporation sources or two ion beam sources, or two chemical vapor deposition (CVD) processes, or a combination of these sources.

(6) The temperature of the substrate can be controlled (by heating or cooling) as to change the cermet growth conditions and thus affect the metal particle size and distribution.

The cermet preparation method of this invention can also be used to prepare cermets with more than two components, including multiple metals and multiple insulators. For example, in the embodiment of FIG. 3, a metal cermet can be prepared by adding a second metal sputtering target in a configuration similar to that of the two targets in FIG. 3. The three targets can be arranged to be equally spaced with respect to each other or in any other desired asymmetric arrangement. These and all other variations which basically rely on the teachings through which this disclosure has advanced the art are properly considered within the scope of this invention.

We claim:

1. A method of forming a two-phase metal/insulator composite material (cermet) with substantially spherical metal particles uniformly sized to have a narrow size distribution and uniformly distributed in the insulator, said method having separate control of relative metal and insulator composition of the cermet and metal particle size and including the steps of:

sputter depositing a metal on a substrate from a metal deposition source, the amount of metal deposited being from about 0.15 angstroms to about 13 angstroms;

discontinuing sputter deposition of the metal deposition on the substrate before a continuous film of the metal is formed so that at least some of the sputter deposited metal particles, not at the boundary of the substrate, have at least a side portion not touching another sputter deposited metal particle;

sputter depositing an insulator on the substrate from an insulator deposition source the amount of insulator deposited being from 5.5 to 5.6 times the amount of metal deposited during the previous metal deposition;

discontinuing the sputter deposition of the insulator, and repeating the above steps until the desired film thickness of the cermet is obtained, the metal being deposited in sufficiently small quantities so that only a discontinuous film of the metal is formed, such repetition of the above steps producing uniformly distributed particles of the metal throughout the cermet.

2. A method as recited in claim 1 wherein the sequential deposition of metal and insulator is done by:

mounting the substrate for selective exposure with respect to the metal deposition source and the insulator deposition source:

sputter depositing metal onto the substrate from the metal source when the substrate is exposed to the metal deposition source;

sputter depositing insulator onto the substrate from the insulator source when the substrate is exposed to the insulator deposition source; and continuing selective exposure of the substrate to the metal deposition source and the insulator deposition source until the desired film thickness is obtained, the relative rate of depositing the first metal and the insulator determining the relative metal and insulator composition of the cermet and the duration of each deposition determining the metal particle size in the cermet.

3. A method as recited in claim 2, wherein the selective exposure of the substrate to the metal and insulator deposition sources is done by:

rotating a substrate so as to be successively adjacent the metal deposition source and the insulator depositon source;

sputter depositing metal onto the substrate from a metal source during a first portion of the rotation path of the substrate;

sputter depositing an amount of the insulator on the substrate from an insulator source during a second portion of the rotation path of the substrate; and continuing rotations of the substrate until the desired film thickness of the cermet is obtained.

4. A method as recited in claim 2 wherein the selective exposure of the substrate to the metal and insulator deposition sources is done by:

selectively applying power to the metal and insulator deposition sources;

sputter depositing metal onto the substrate from the metal deposition source when power is applied to the metal deposition source;

sputter depositing insulator onto the substrate from the insulator deposition source when the power is applied to the insulator deposition source; and continuing selective, sequential sputter deposition of metal and insulator on the substrate until the desired film thickness of the cermet is obtained.

5. A method as recited in claim 2 wherein the selective exposure of the substrate to the metal and insulator deposition source is done by:

rotating the metal and insulator deposition sources with respect to the substrate;

sputter depositing metal onto the substrate from the metal source during a portion of the rotation path of the metal deposition source adjacent the substrate;

sputter depositing insulator into the substrate from the insulator source during a portion of the rotation path of the insulator deposition source adjacent the substrate; and continuing rotations of the metal and insulator deposition sources until the desired film thickness of the cermet is obtained.

6. A method as recited in claim 2 wherein the selective exposure of the substrate to the metal and insulator is done by:

selectively opening a first path between the substrate and the metal deposition source and a second path between the substrate and the insulator deposition source;

sputter depositing metal onto the substrate from the metal source when the first path between the substrate and the metal deposition source is open;

sputter depositing insulator onto the substrate from the insulator source when the second path between the substrate and the insulator depositon source is open; and continuing selective opening of the first and second paths and sequential deposition of the metal and insulator until the desired film thickness of the cermet is obtained.

7. A method as recited in claim 3, wherein the frequency of rotation is in the range 10 to $10^{-5}$ Hz and determines the metal particle size in the cermet.

8. A method as recited in claim 3 wherein the depth of deposition per pass under each target is in the range from about one-tenth of an angstrom to about two hundred angstroms.

* * * * *